United States Patent
Lai et al.

(10) Patent No.: US 11,728,824 B2
(45) Date of Patent: Aug. 15, 2023

(54) ANALOG CIRCUIT AND COMPARATOR SHARING METHOD OF ANALOG CIRCUIT

(71) Applicant: Realtek Semiconductor Corporation, Hsinchu (TW)

(72) Inventors: Yen-Po Lai, Hsinchu (TW); Chih-Lung Chen, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 63 days.

(21) Appl. No.: 17/456,596

(22) Filed: Nov. 26, 2021

(65) Prior Publication Data
US 2022/0385302 A1 Dec. 1, 2022

(30) Foreign Application Priority Data

May 26, 2021 (TW) .................................. 110119120

(51) Int. Cl.
*H03M 1/12* (2006.01)
*H03M 3/00* (2006.01)
*H03K 5/24* (2006.01)
*H03M 1/38* (2006.01)

(52) U.S. Cl.
CPC .............. *H03M 3/466* (2013.01); *H03K 5/24* (2013.01); *H03M 1/1205* (2013.01); *H03M 1/38* (2013.01)

(58) Field of Classification Search
CPC ...... H03M 1/38; H03M 1/1205; H02M 3/466; H03K 5/24
USPC .................................................. 341/141, 155
See application file for complete search history.

(56) References Cited

U.S. PATENT DOCUMENTS

| 6,456,086 B1 * | 9/2002 | Bolz .......................... G06F 1/24 340/661 |
| 2014/0354353 A1 | 12/2014 | Hampel et al. |
| 2016/0006449 A1 * | 1/2016 | Spevak .................. H03M 1/34 341/155 |
| 2017/0353685 A1 * | 12/2017 | Liu ........................ H03M 1/804 |
| 2020/0186160 A1 | 6/2020 | Kulkarni et al. |

OTHER PUBLICATIONS

D. Kim et al., "8.2 Fully Integrated Low-Drop-Out Regulator Based on Event-Driven PI Control," 2016 IEEE International Solid-State Circuits Conference (ISSCC), San Francisco, CA, 2016, pp. 148-149.

* cited by examiner

*Primary Examiner* — Peguy Jean Pierre
(74) *Attorney, Agent, or Firm* — CKC & Partners Co., LLC

(57) ABSTRACT

An analog circuit including a voltage regulator, at least one analog-to-digital convertor (ADC), at least one comparator and a multiplexer is provided. The voltage regulator generates an output voltage. The at least one ADC generates at least one digital signal. The multiplexer is configured to conduct the at least one comparator to either the voltage regulator or the at least one ADC. When the voltage regulator is triggered, the multiplexer conducts the at least one comparator to the voltage regulator, and the voltage regulator generates the output voltage according to an output of the at least one comparator. When the at least one ADC is triggered, the multiplexer conducts the at least one comparator to the at least one ADC, and the at least one ADC generates the at least one digital signal according to the output of the at least one comparator.

18 Claims, 9 Drawing Sheets

US 11,728,824 B2

ANALOG CIRCUIT AND COMPARATOR SHARING METHOD OF ANALOG CIRCUIT

RELATED APPLICATIONS

This application claims priority to Taiwan Application Serial Number 110119120, filed on May 26, 2021, which is herein incorporated by reference in its entirety.

BACKGROUND

Technical Field

The present disclosure relates to an analog circuit and a driving method thereof. More particularly, the present disclosure relates to an analog circuit sharing a comparator and a comparator sharing method thereof.

Description of Related Art

Linear regulators are widely used in peripheral circuits of a processor. A linear regulator adaptively adjusts the power thereof according to load variation to generate a stable output voltage. The performance and stability of the processor are directly affected by temperature variation. Therefore, the peripheral circuits of the processor usually include multiple temperature sensors in order to calibrate the processor according to the temperature, in which these temperature sensors can be implemented by various analog-to-digital convertors.

SUMMARY

The disclosure provides an analog circuit including a voltage regulator, at least one analog-to-digital convertor (ADC), at least one comparator and a multiplexer. The voltage regulator is configured to generate an output voltage. The at least one ADC is configured to generate at least one digital signal. The multiplexer is coupled with the voltage regulator, the at least one ADC and the at least one comparator. The multiplexer is configured to conduct the at least one comparator to either the voltage regulator or the at least one ADC. When the voltage regulator is triggered, the multiplexer conducts the at least one comparator to the voltage regulator, and the voltage regulator generates the output voltage according to an output of the at least one comparator. When the at least one ADC is triggered, the multiplexer conducts the at least one comparator to the at least one ADC, and the at least one ADC generates the at least one digital signal according to the output of the at least one comparator.

The disclosure provides a comparator sharing method of an analog circuit. The method includes the following operations: when a voltage regulator is triggered, using a multiplexer to conduct at least one comparator to the voltage regulator, in which the voltage regulator generates an output voltage of the voltage regulator according to an output of the at least one comparator; and when at least one ADC is triggered, using the multiplexer to conduct the at least one comparator to the at least one ADC, in which the at least one ADC generates at least one digital signal of the at least one ADC according to the output of the at least one comparator. The multiplexer is coupled with the voltage regulator, the at least one ADC and the at least one comparator.

One of the advantages of the above analog circuit and comparator sharing method is reducing the overall circuit area.

It is to be understood that both the foregoing general description and the following detailed description are by examples, and are intended to provide further explanation of the disclosure as claimed.

DETAILED DESCRIPTION

Figure 1:
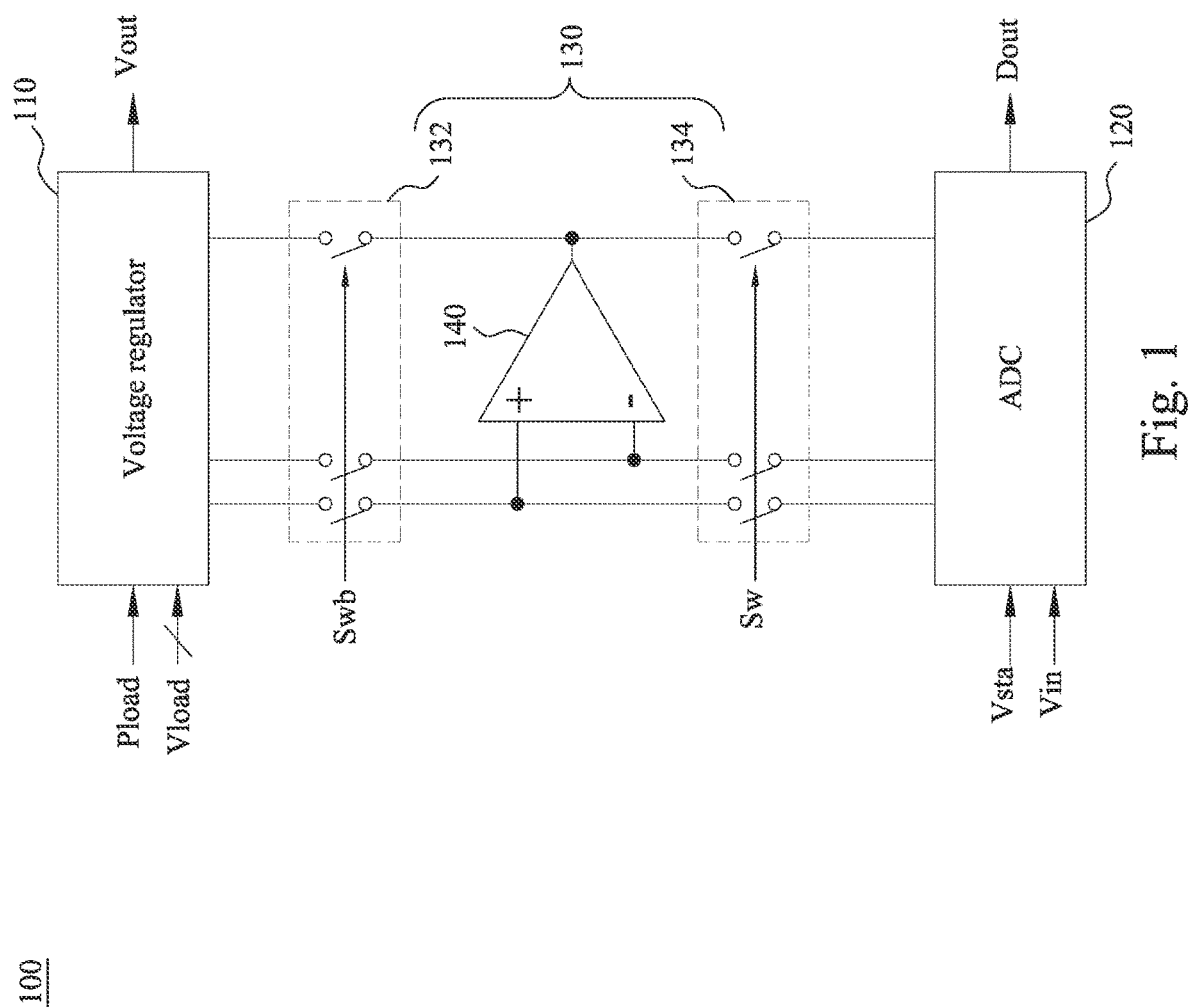
FIG. 1 is a simplified functional block diagram of an analog circuit according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of an analog circuit 100 according to one embodiment of the present disclosure. In some embodiments, the analog circuit 100 is part of peripheral circuits of a processor (not shown), in which the analog circuit 100 may provide an operating voltage to the processor and may detect the environment temperature so that the processor can perform self-calibration base on the temperature. The analog circuit 100 comprises a voltage regulator 110, an analog-to-digital convertor (ADC) 120, a multiplexer 130 and a comparator 140. The voltage regulator 110 is coupled with the comparator 140 through the multiplexer 130. The voltage regulator 110 is configured to generate an output voltage Vout, and is configured to receive a control signal Pload and a load voltage Vload. When the voltage regulator 110 is triggered by the control signal Pload, the voltage regulator 110 analyzes the load voltage Vload to obtain magnitude of the present load, so as to adaptively adjust the power thereof to generate the stable output voltage Vout. In some embodiments, the output voltage Vout is used as the operating voltage of the processor. In other embodiments, the voltage regulator 110 is a digital low dropout linear regulator (DLDO), but this disclosure is not limited thereto.

The ADC 120 is coupled to the comparator 140 through the multiplexer 130. The ADC 120 is configured to generate a digital signal Dout, and is configured to receive a control signal Vsta and an input voltage Vin. When the ADC 120 is triggered by the control signal Vsta, the ADC 120 converts the input voltage Vin to generate a digital signal Dout. In some embodiments, the input voltage Vin is positive or negative correlative with the environment temperature. Therefore, the digital signal Dout can be used to convey the current environment temperature to the processor, so that the processor performs self-calibrate based on the environment temperature. The ADC 120 may be implemented by an incremental delta-sigma ADC, a delta-sigma modulator or a successive approximation register (SAR) ADC, but this disclosure is not limited thereto.

The multiplexer 130 is coupled with the voltage regulator 110, the ADC 120 and the comparator 140, and is configured to conduct the comparator 140 to either the voltage regulator 110 or the ADC 120. The multiplexer 130 comprises a switch circuit 132 and a switch circuit 134. The switch circuit 132 is coupled between the voltage regulator 110 and the comparator 140, and the switch circuit 134 is coupled between the ADC 120 and the comparator 140. As shown in FIG. 1, the switch circuit 132 and the switch circuit 134 are controlled by the multiplexing signals Swb and Sw, respectively, to perform switching operations, in which the multiplexing signals Swb and Sw are opposite in phase.

When the voltage regulator 110 is triggered by the control signal P load, the multiplexer 130 conducts the switch circuit 132 and switches off the switch circuit 134 to conduct the comparator 140 to the voltage regulator 110. In this situation, the voltage regulator 110 generates the output voltage Vout according to an output of the comparator 140. On the other hand, when the ADC 120 is triggered by the control signal Vsta, the multiplexer 130 switches off the switch circuit 132 and conducts the switch circuit 134 to conduct the comparator 140 to the ADC 120. In this case, the ADC 120 generates the digital signal Dout according to the output of the comparator 140.

In some embodiments, the control signal Pload is configured to trigger the voltage regulator 110 when the load of the voltage regulator 110 changes. For example, the control signal Pload and the load voltage Vload may be generated by the aforementioned processor. In this case, the voltage regulator 110 obtains the magnitude of the present load by using the comparator 140 to analyze the load voltage Vload, so as to adjust the output power of the voltage regulator 110. On the other hand, when the load of the voltage regulator 110 remains stable, the control signal Pload does not trigger the voltage regulator 110, and the voltage regulator 110 may maintain the output power thereof without occupying the comparator 140. When the voltage regulator 110 releases the comparator 140, the ADC 120 may use the comparator 140 to perform an analog-to-digital conversion. As can be appreciated from the above, the overall circuit area of the analog circuit 100 can be reduced by sharing the comparator 140.

Figure 2:
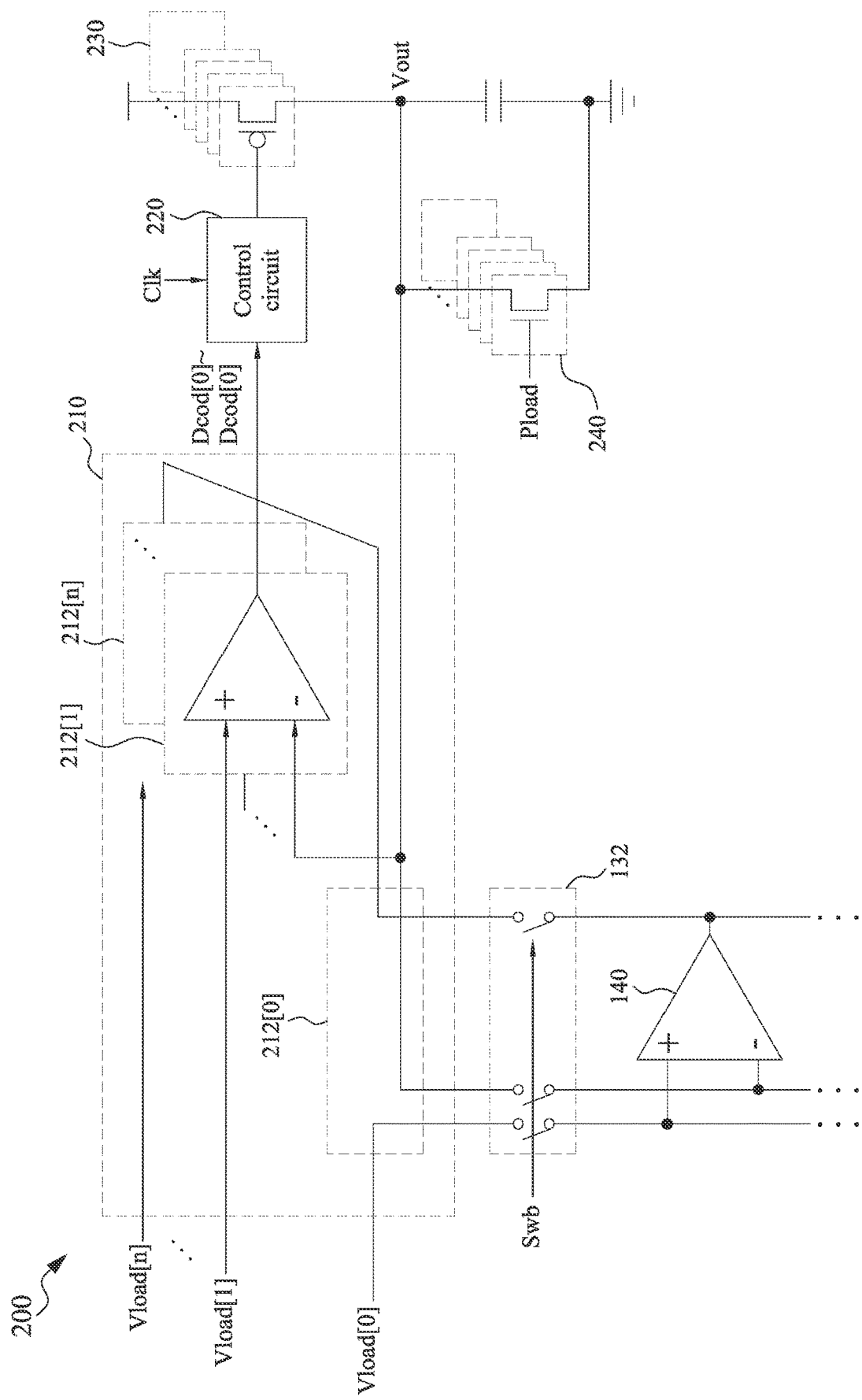
FIG. 2 is a simplified functional block diagram of a digital low dropout linear regulator, according to one embodiment of the present disclosure.

FIG. 2 is a simplified functional block diagram of a digital low dropout linear regulator 200 (hereinafter referred to as the "voltage regulator 200"), according to one embodiment of the present disclosure. In some embodiments, the voltage regulator 200 may be used to implement the voltage regulator 110 of FIG. 1, that is, the load voltage Vload of FIG. 1 comprises load voltages Vload[0]-Vload[n] of FIG. 2. The voltage regulator 200 comprises an ADC 210, a control circuit 220, a plurality of power transistors 230 and a trigger circuit 240.

The ADC 210 comprises a plurality of comparators 212[0]-212[n]. The comparators 212[0]-212[n] have non-inverted input nodes configured to receive the load voltages Vload[0]-Vload[n], respectively, and also have inverted input nodes configured to receive the output voltage Vout via a feedback path. Output nodes of the comparators 212[0]-212[n] are coupled with the control circuit 220. The comparators 212[0]-212[n] are configured to provide digital codes Dcod[0]-Dcod[n], obtained by analyzing the load voltages Vload[0]-Vload[n], to the control circuit 220.

The control circuit 220 temporarily stores the digital codes Dcod[0]-Dcod[n] according to a clock signal Clk, and determines a number of conducted power transistors 230 according to the digital codes Dcod[0]-Dcod[n] to adjust the output voltage Vout. In some embodiments, the control circuit 220 comprises multi-level registers configured to temporarily store the digital codes Dcod[0]-Dcod[n]. The trigger circuit 240 is coupled with the feedback path between the power transistor 230 and the ADC 210, and comprises a plurality of transistors. The control signal Pload sets a voltage on the feedback path to ground level by conducting transistors of the trigger circuit 240, thereby triggering the voltage regulator 200 to start to analyze the load voltages Vload[0]-Vload[n] in order to adjust the output voltage Vout.

Figure 3:
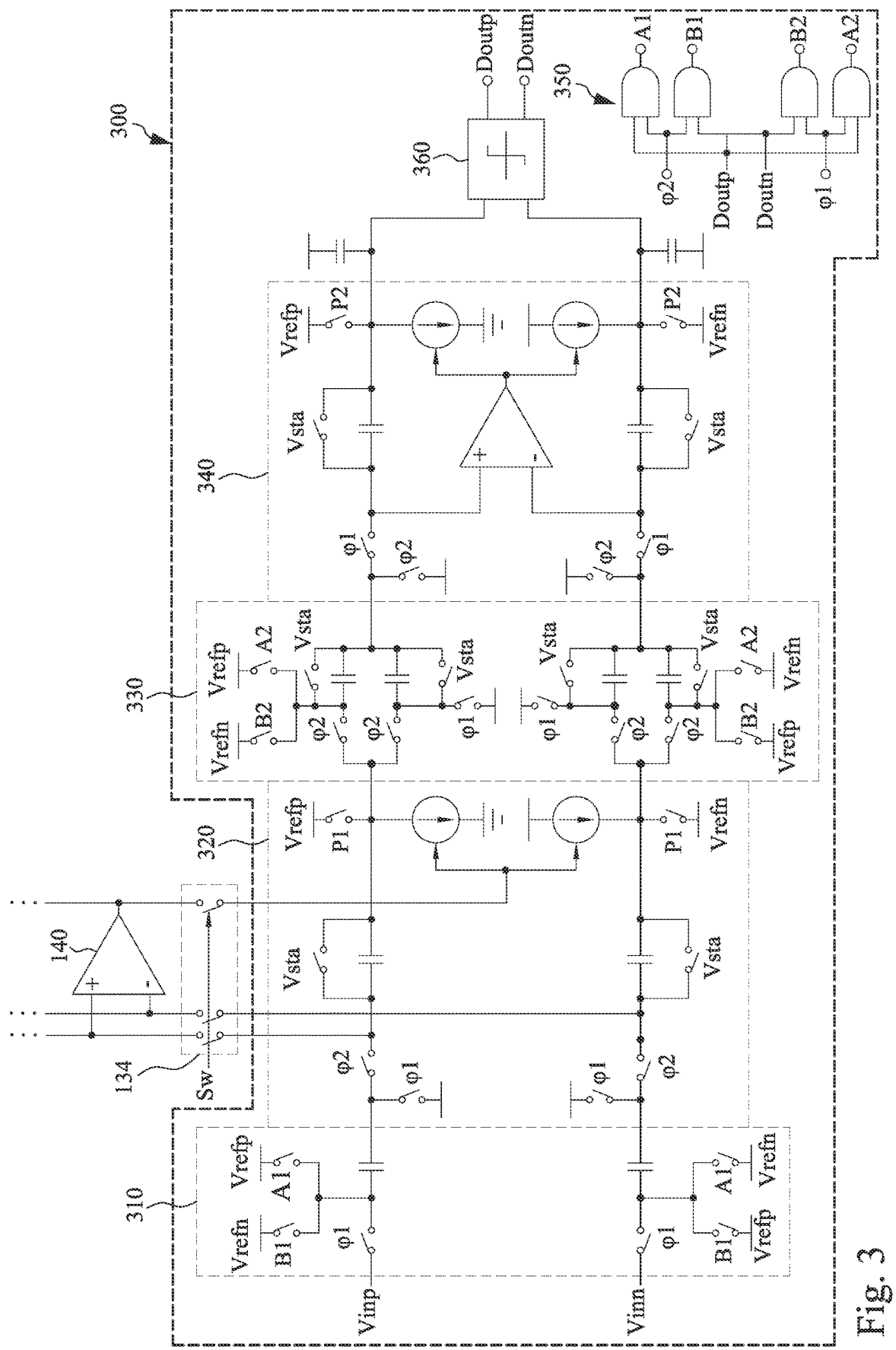
FIG. 3 is a simplified functional block diagram of an incremental delta-sigma analog-to-digital convertor (ADC), according to one embodiment of the present disclosure.

As can be appreciated from FIG. 2, when the voltage regulator 200 is triggered, the switch circuit 132 conducts the comparator 140 to the voltage regulator 200 so that the comparator 140 is operated as the comparator 212[0] of the ADC 210 (which is marked by a dashed box in FIG. 2, such portion in the dashed box is substantially coupled to the comparator 140 through the switch circuit 132). In this situation, the non-inverted input node of the comparator 140 is configured to receive the load voltage Vload[0]; the inverted input node of the comparator 140 is configured to receive the output voltage Vout; the output node of the comparator 140 is configured to output the digital code Dcod[0] to the control circuit 220, but this disclosure is not limited thereto. In some embodiments, the comparator 140 may be operated as any one of the comparators 212[0]-212[n] of the ADC 210. FIG. 3 is a simplified functional block diagram of an incremental delta-sigma ADC 300 (hereinafter referred to as the "ADC 300"), according to one embodiment of the present disclosure. In some embodiments, the ADC 300 can be used to implement the ADC 120 of FIG. 1. That is, the input voltage Vin of FIG. 1 comprises differential input voltages Vinn and Vinp of FIG. 3, and the digital signal Dout of FIG. 1 comprises differential digital signals Doutn and Doutp of FIG. 3. The ADC 300 comprises a sampling circuit 310, an integrator 320, a sampling circuit 330, an integrator 340, a logic circuit 350 and a quantizer 360, so as to process the input voltages Vinn and Vinp by a two-stage integration to generate the digital signals Doutn and Doutp, but this disclosure is not limited thereto. In some embodiments, the ADC 300 comprises more than two sets of the combination of the sampling circuit and the integrator.

The ADC 300 receives switch signals $\varphi 1$ and $\varphi 2$ in opposite phases to establish differential integration and differential sampling. For example, when the sampling circuit 310 performs sampling, the integrator 340 performs integration; and when the sampling circuit 330 performs sampling, the integrator 320 performs integration. The quantizer 360 is configured to quantize outputs of the integrator 340 to generate digital signals Doutn and Doutp.

The logic circuit 350 generates a set of phase-opposite switch signals A1 and B1 and another set of phase-opposite switch signals A2 and B2 according to the switch signals $\varphi 1$ and $\varphi 2$ and the digital signals Doutn and Doutp. Switches controlled by the switch signals A1, B1, A2 and B2 are configured to implement negative feedback. In addition, switches controlled by a switch signal P1 are configured to preset a non-inverted output node (an upper node) and an inverted output node (a lower node) of the integrator 320 to a positive reference voltage Vrefp and a negative reference voltage Vrefn, respectively. Therefore, in the process of integration, a voltage at the non-inverted output node of the integrator 320 can gradually decrease due to a current source, and a voltage at the inverted output node of the integrator 320 can gradually increase due to another current source. Similarly, switches controlled by a switch signal P2 are configured to preset a non-inverted output node (an upper node) and an inverted output node (a lower node) of the integrator 340 to the positive reference voltage Vrefp and the negative reference voltage Vrefn, respectively.

The control signal Vsta is configured to reset the ADO 300, and is configured to trigger the ADC 300 to convert input voltages Vinn and Vinp to generate the digital signals Doutn and Doutp. As can be appreciated from FIG. 3, when the ADC 300 is triggered, the switch circuit 134 conducts the comparator 140 to the ADC 300. In this case, the comparator 140 may be operated as the integrator 320 of the ADC 300, but this disclosure is not limited thereto. In some embodiments, the comparator 140 can be operated as any one of the plurality of integrators of the ADC 300. That is, the voltage regulator 200 and the ADC 300 share the comparator 140, and the comparator 140 is operated as part of the ADC 300 when the ADC 300 is triggered.

Figure 4:
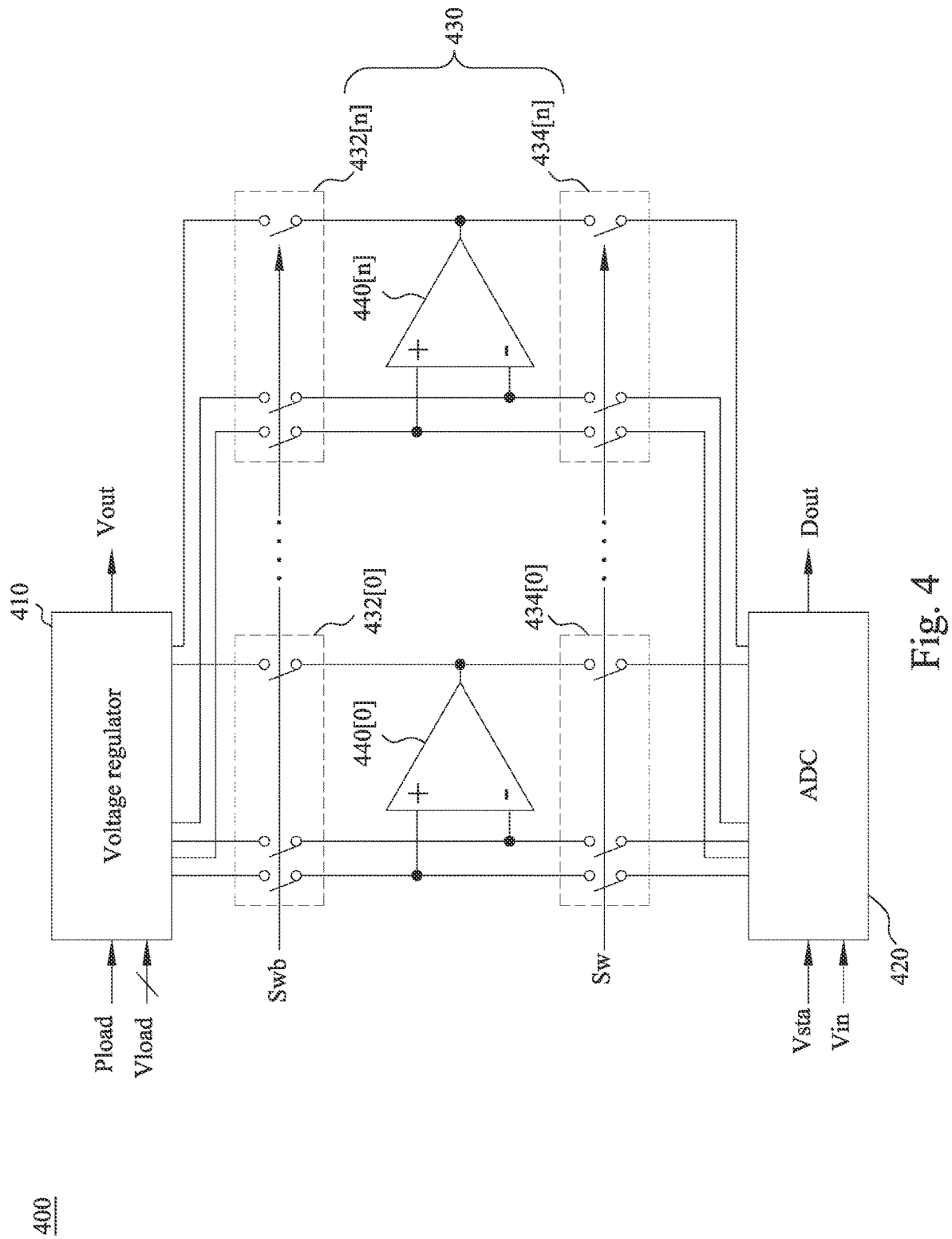
FIG. 4 is a simplified functional block diagram of an analog circuit according to one embodiment of the present disclosure.

FIG. 4 is a simplified functional block diagram of an analog circuit 400 according to one embodiment of the present disclosure. The analog circuit 400 comprises a voltage regulator 410, an ADC 420, a multiplexer 430 and a plurality of comparators 440[0]-440[n]. The voltage regulator 410 is configured to generate the output voltage Vout, and is configured to receive the control signal Pload and the load voltage Vload. The ADC 420 is configured to generate the digital signal Dout, and is configured to receive the control signal Vsta and the input voltage Vin. The multiplexer 430 is configured to conduct the comparators 440[0]-440[n] to either the voltage regulator 410 or the ADC 420. In some embodiments, the voltage regulator 410 is a digital low dropout linear regulator, but this disclosure is not limited thereto. The ADC 420 may be implemented by the incremental delta-sigma ADC, the delta-sigma modulator or the SAR ADC, but this disclosure is not limited thereto.

The multiplexer 430 comprises a plurality of switch circuits 432[0]-432[n] and a plurality of switch circuits 434[0]-434[n]. The switch circuits 432[0]-432[n] and the switch circuits 434[0]-434[n] are controlled by the multiplexing signals Swb and Sw, respectively, to perform switching operations, in which the multiplexing signals Swb and Sw are phase-opposite signals. First terminals of the switch circuits 432[0]-432[n] are coupled with the voltage regulator 410, and second terminals of the switch circuit 432[0]-432[n] are coupled with the comparators 440[0]-440[n], respectively. First terminals of the switch circuits 434[0]-434[n] are coupled with the comparators 440[0]-440[n], respectively, and second terminals of the switch circuits 434[0]-434[n] are coupled with the ADC 420.

When the voltage regulator 410 is triggered by the control signal Pload, the multiplexer 430 conducts the switch circuits 432[0]-432[n] and switches off the switch circuits 434[0]-434[n] in order to conduct all of the comparators 440[0]-440[n] to the voltage regulator 410. In this case, the voltage regulator 410 generates the output voltage Vout according to outputs of the comparators 440[0]-440[n]. Referring to FIG. 2 and FIG. 4, for example, the voltage regulator 200 of FIG. 2 may be used to implement the voltage regulator 410 of FIG. 4. When the voltage regulator 410 is triggered by the control signal Pload, the comparators 440[0]-440[n] of FIG. 4 are operated as (or can be understood as "replaced") the comparators 212[0]-212[n] of the ADC 210 of FIG. 2, respectively. That is, a non-inverted input node and an inverted input node of the comparator 440[0] receive the load voltage Vload[0] and the output voltage Vout, respectively, via the switch circuit 432[0], and an output node of the comparator 440[0] is coupled with the control circuit 220 through the switch circuit 432[0]; a non-inverted input node and an inverted input node of the comparator 440[1] receive the load voltage Vload[1] and the output voltage Vout, respectively, via the switch circuit 432[1], an output node of the comparator 440[1] is coupled with the control circuit 220 through the switch circuit 432[1], and so forth.

On the other hand, when the ADC 420 is triggered, the multiplexer 430 conducts the switch circuits 434[0]-434[n] and switches off the switch circuits 432[0]-432[n] in order to conduct all of the comparators 440[0]-440[n] to the ADC 420. In this case, the ADC 420 generates the digital signal Dout according to the outputs of the comparators 440[0]-440[n]. Referring to FIG. 3 and FIG. 4, in an embodiment that n is one (i.e., value 1), the ADC 300 of FIG. 3 can be used to implement the ADC 420 of FIG. 4. When the ADC 420 is triggered by the control signal Vsta, the comparators 440[0]-440[1] are operated as part of the integrator 320 and part of the integrator 340, respectively. That is, the non-inverted input node and the inverted input node of the comparator 440[0] are coupled with the non-inverted output node (the upper node) and the inverted output node (the lower node) of the sampling circuit 310, respectively, through the switch circuit 434[0], and the output node of the comparator 440[0] is coupled with the current source of the integrator 320 through the switch circuit 434[0]; the non-inverted input node and inverted input node of the comparator 440[1] are coupled with the non-inverted output node (the upper node) and the inverted output node (the lower node) of the sampling circuit 330, respectively, through the switch circuit 434 [1], the output node of the comparator 440[1] is coupled with the current source of the integrator 340 through the switch circuit 434 [1] (i.e., the comparator depicted in the integrator 340 of FIG. 3 can be replaced by the comparator 440[1] of FIG. 4), and so forth.

Accordingly, when the ADO 420 is triggered, the comparators 440[0]-440[n] are operated as parts of the plurality of integrators of the ADC 420, respectively. The foregoing descriptions regarding to other corresponding implementations and advantages of the analog circuit 100 are also applicable to the analog circuit 400. For the sake of brevity, those descriptions are omitted.

Figure 5:
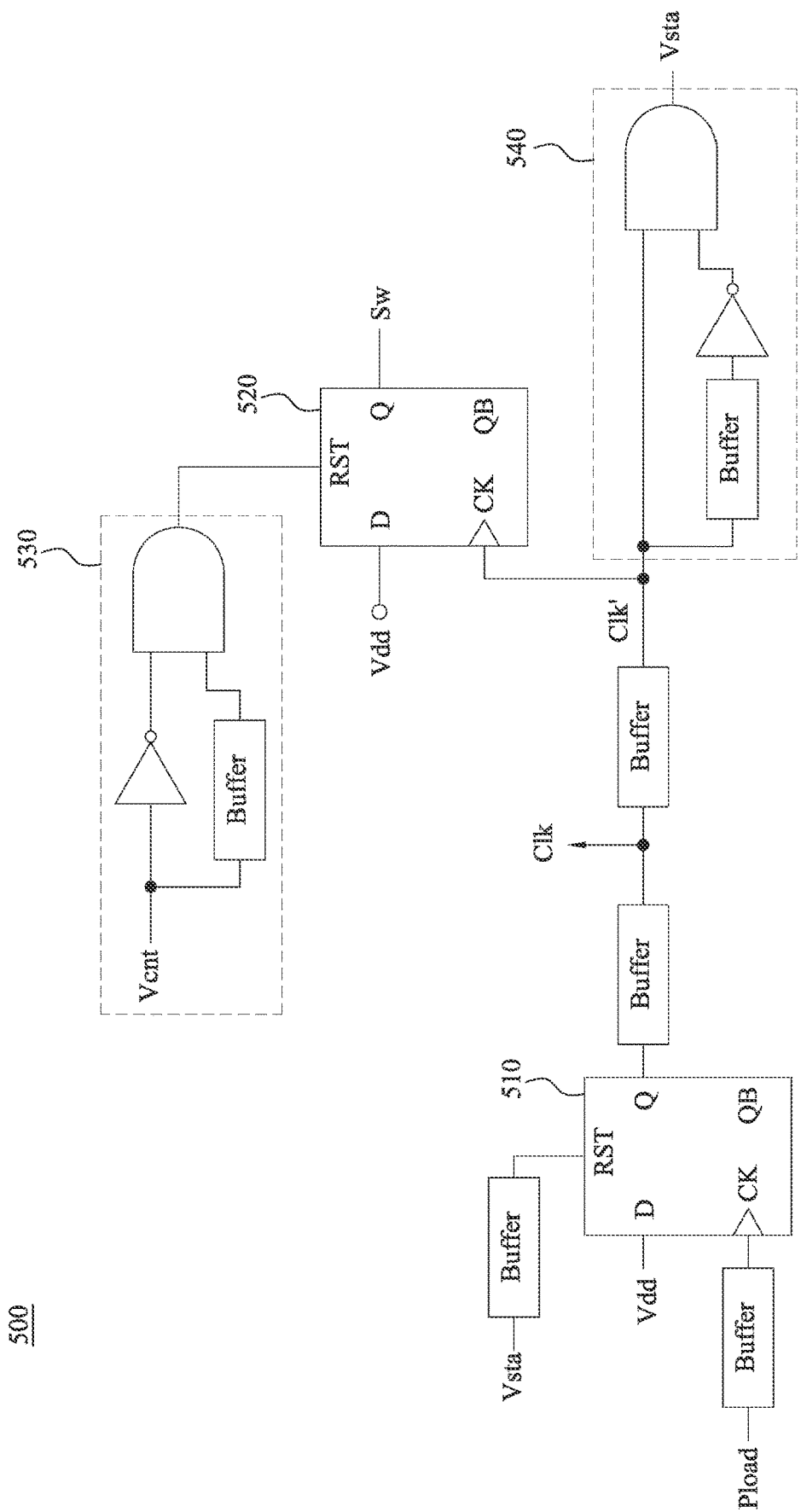
FIG. 5 is a simplified functional block diagram of a control circuit according to one embodiment of the present disclosure.
Figure 6:
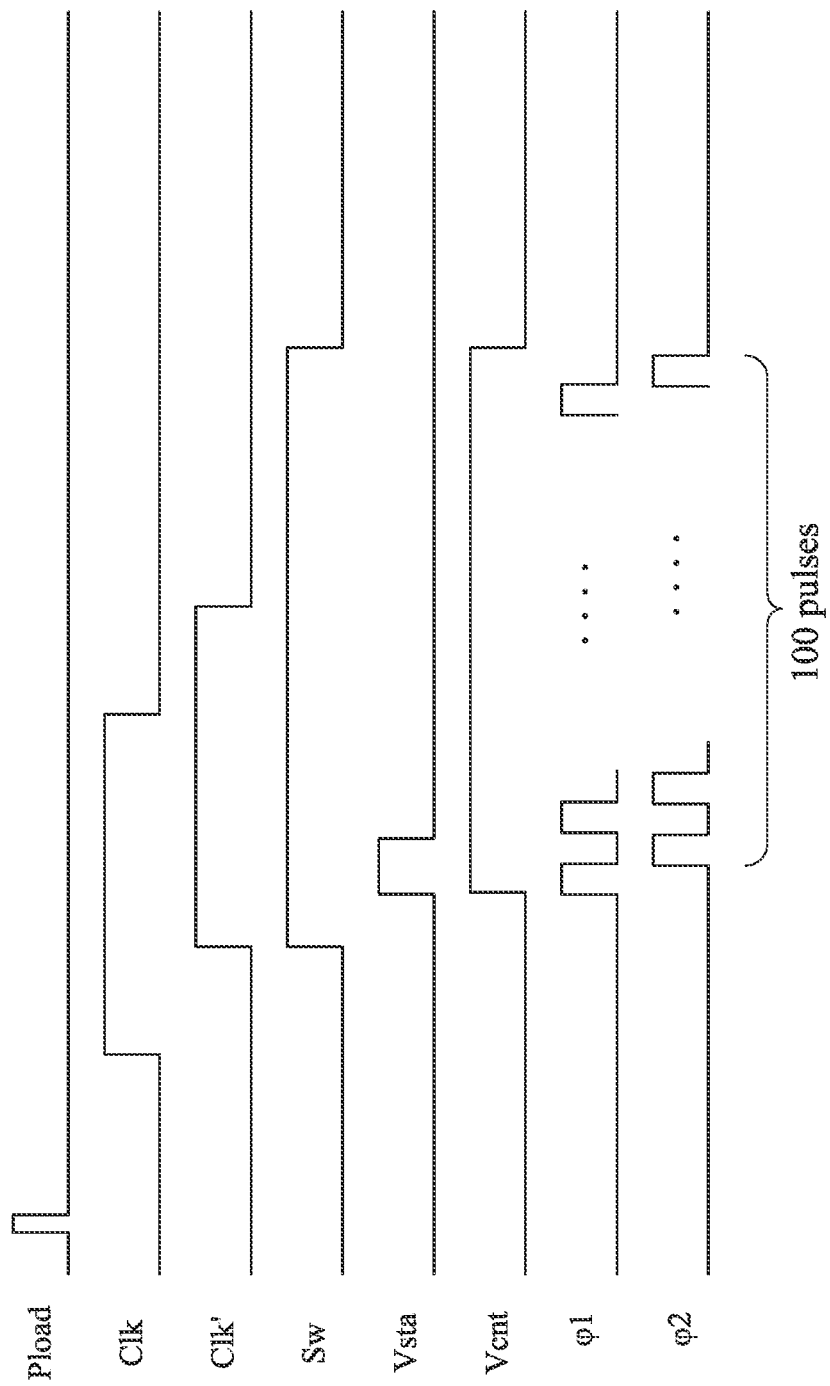
FIG. 6 is a waveform schematic diagram of signals of the control circuit of FIG. 5.

FIG. 5 is a simplified functional block diagram of a control circuit 500 according to one embodiment of the present disclosure. FIG. 6 is a waveform schematic diagram of signals of the control circuit 500. In some embodiments, the analog circuit 100 of FIG. 1 and the analog circuit 400 of FIG. 4 further comprise the control circuit 500, in which the control circuit 500 is configured to generate the multiplexing signal Sw. The control circuit 500 comprises a register 510, a register 520, a logic circuit 530 and a logic circuit 540.

The register 510 receives the control signal Pload and the control signal Vsta through the clock input node CK and the reset node RST, respectively. The non-inverted data output node Q of the register 510 is configured to output a clock signal Clk. The register 520 receives a delayed clock signal Clk' by the clock input node CK, and is coupled with the logic circuit 530 by the reset node RST, in which the logic circuit 530 is configured to response to a falling edge of a control signal Vcnt to output a pulse. The non-inverted data output node Q of the register 520 is configured to output the multiplexing signal Sw. In addition, the data input nodes D of the register 510 and the register 520 are both configured to receive an operating voltage Vdd. The multiplexing signal Sw is configured to control the multiplexer 130 of FIG. 1 or the multiplexer 430 of FIG. 4. In some embodiments, the multiplexing signal Swb may be generated by inputting the multiplexing signal Sw to an inverter (not shown), or directly generated by the inverted data output node QB of the register 520. In addition, the logic circuit 540 is configured to generate the control signal Vsta according to the delayed clock signal Clk', that is, the logic circuit 540 is configured to response to a rising edge of the delayed clock signal Clk' to generate a pulse of the control signal Vsta.

As shown in FIG. 6, when the register 510 is triggered by the control signal Pload, the register 510 outputs the clock signal Clk having a first logic value (e.g., logic 1). When the register 510 is triggered by the control signal Vsta, the register 510 outputs the clock signal Clk having a second logic value (e.g., logic 0). In addition, when the register 520 is triggered by the delayed clock signal Clk', the register 520 outputs the multiplexing signal Sw having the first logic value (e.g., logic 1). When the register 520 is triggered by the control signal Vcnt (i.e., triggered by the pulse outputted by the logic circuit 530), the register 520 outputs the multiplexing signal Sw having the second logic value (e.g., logic 0).

In this embodiment, the control signal Vcnt may be generated by the ADC 120, the ADC 300 or the ADC 420. The control signal Vcnt is a signal that indicates an analog-to-digital conversion performed by the ADC is completed. Take the ADC 300 of FIG. 3 as an example, the ADC 300 may comprise a counter (not shown) configured to count a number of pulses of the switch signal φ2 to generate the control signal Vcnt. During an analog-to-digital conversion of the ADC 300, the switch signal φ2 can include a predetermined number of pulses, such as 100 pulses as labeled in FIG. 6, but this disclosure is not limited thereto.

In some embodiments, as shown in FIG. 6, when the ADC 300 is triggered by the control signal Vsta, the switch signal φ2 starts to generate pulses, and the control signal Vcnt is set to the first logic level (e.g., logic 1). If the number of pulses of the switch signal φ2 is less than the predetermined number, it indicates that the analog-to-digital conversion is un-finished, and therefore the counter maintains the control signal Vcnt at the first logic level. If the number of pulses of the switch signal φ2 reaches the predetermined number (e.g., 100), it indicates that the analog-to-digital conversion is finished, and therefore the counter switches the control signal Vcnt to the second logic level (e.g., logic 0) to convey that the analog-to-digital conversion is finished.

Figure 7:
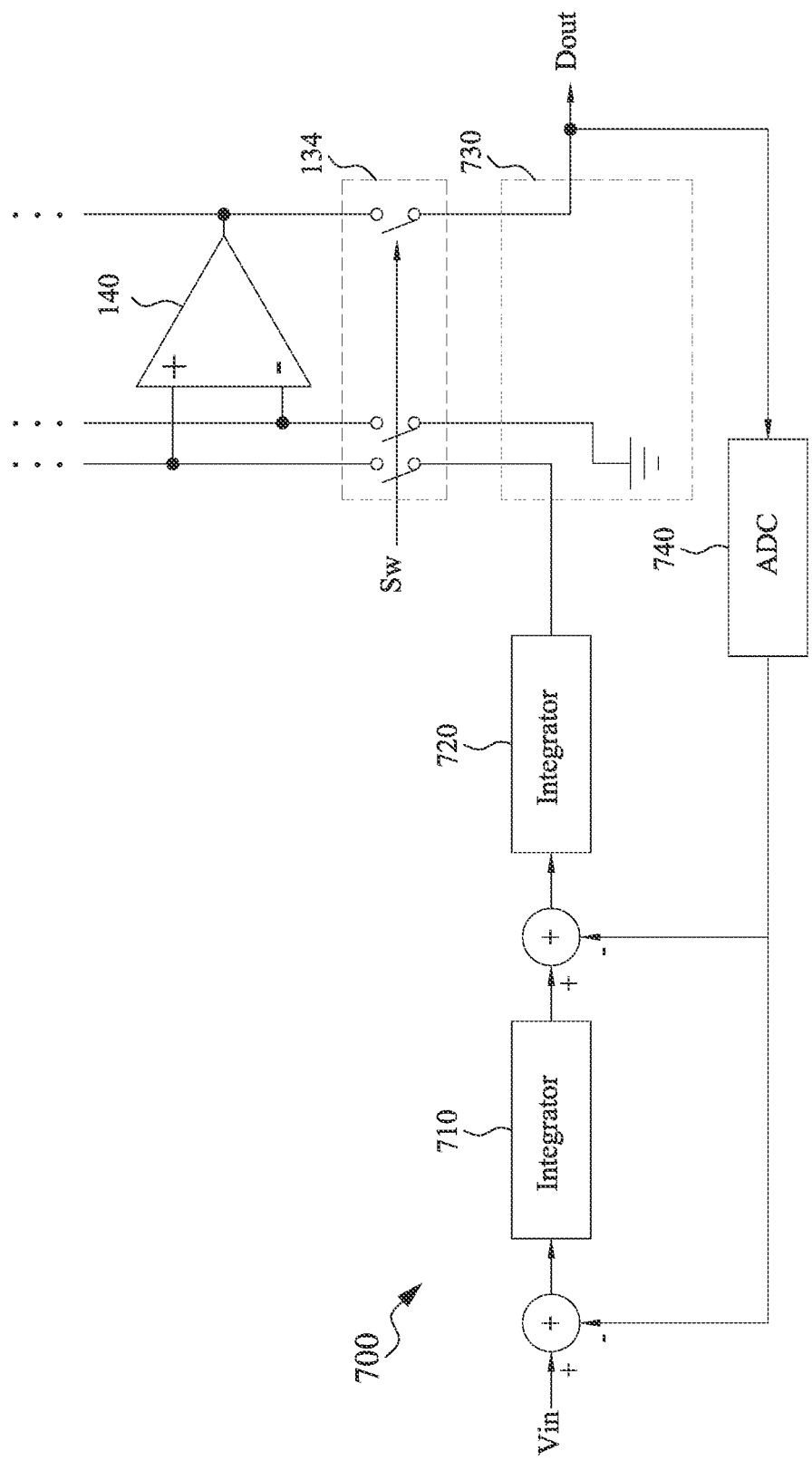
FIG. 7 is a simplified functional block diagram of a delta-sigma modulator according to one embodiment of the present disclosure.

FIG. 7 is a simplified functional block diagram of a delta-sigma modulator 700 according to one embodiment of the present disclosure. In some embodiments, the delta-sigma modulator 700 may be used to implement the ADC 120 of FIG. 1. The delta-sigma modulator 700 may be part of a receiver circuit of a wireless communication system (not shown), and configured to demodulate a received wireless signal (e.g., the input voltage Vin). The delta-sigma modulator 700 comprises an integrator 710, an integrator 720, a quantizer 730 implemented by a comparator and a digital-to-analog convertor (DAC) 740.

When the delta-sigma modulator 700 is triggered to perform demodulation, the switch circuit 134 conducts the comparator 140 to the delta-sigma modulator 700. Therefore, the comparator 140 is operated as the quantizer of the delta-sigma modulator 700, and the delta-sigma modulator 700 generates the digital signal Dout according to the output of the comparator 140.

Figure 8:
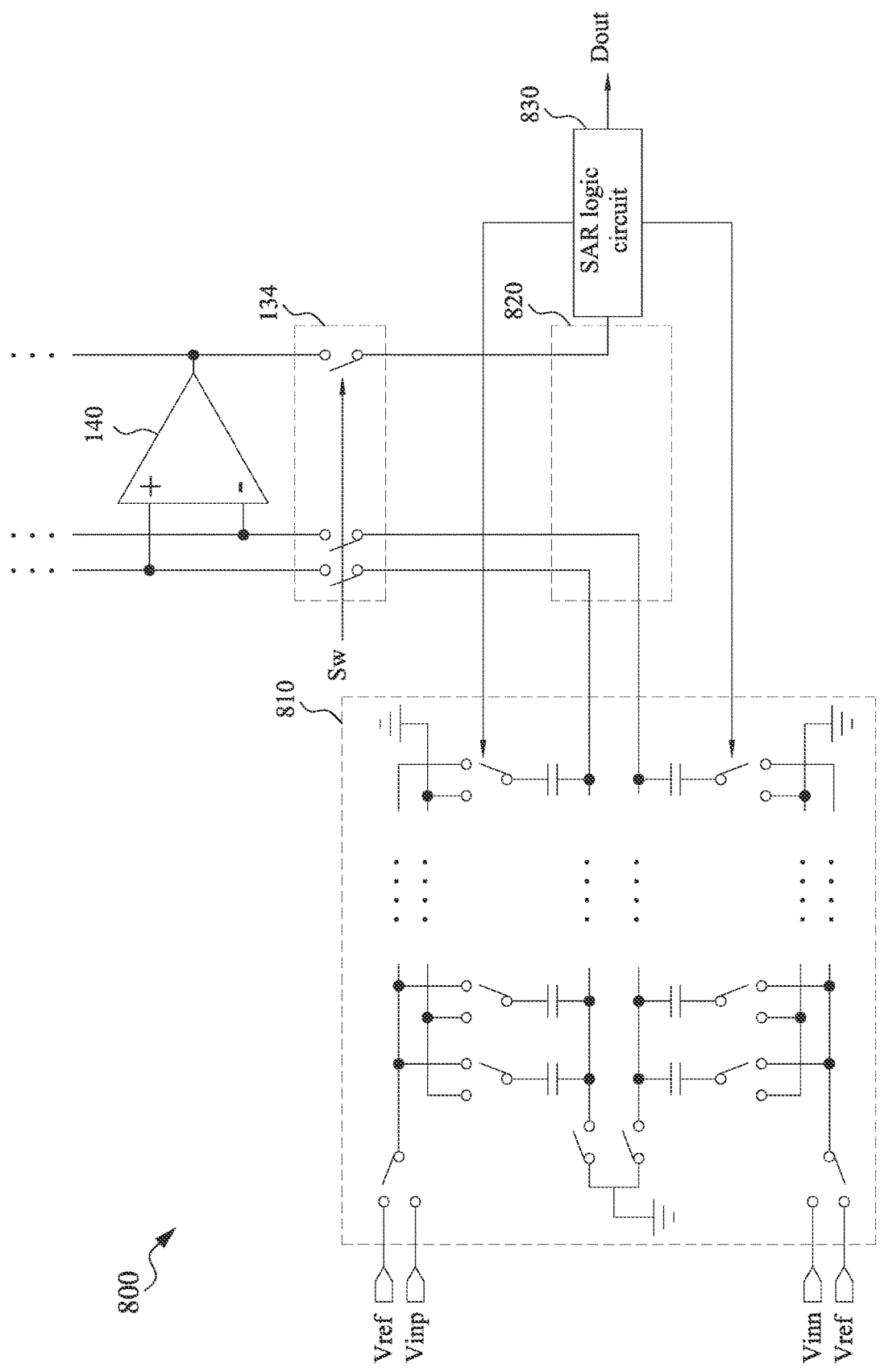
FIG. 8 is a simplified functional block diagram of a successive approximation register ADC, according to one embodiment of the present disclosure.

FIG. 8 is a simplified functional block diagram of a SAR ADC 800 (hereinafter referred to as the "ADC 800"), according to one embodiment of the present disclosure. In some embodiments, the ADC 800 can be used to implement the ADC 120 of FIG. 1. The ADC 800 comprises a sampling capacitor array 810, a comparator 820 and a SAR logic circuit 830. The sampling capacitor array 810 is configured to receive the input voltages Vinp and Vinn and a reference voltage Vref.

When the ADC 800 is triggered to convert the input voltages Vinp and Vinn, the switch circuit 134 conducts the comparator 140 to the ADC 800. Therefore, the comparator 140 is operated as the comparator 820 of the ADC 800, that is, the comparator 140 is coupled between the sampling capacitor array 810 and the SAR logic circuit 830. In this case, the SAR logic circuit 830 generates the digital signal Dout according to the output of the comparator 140.

Figure 9:
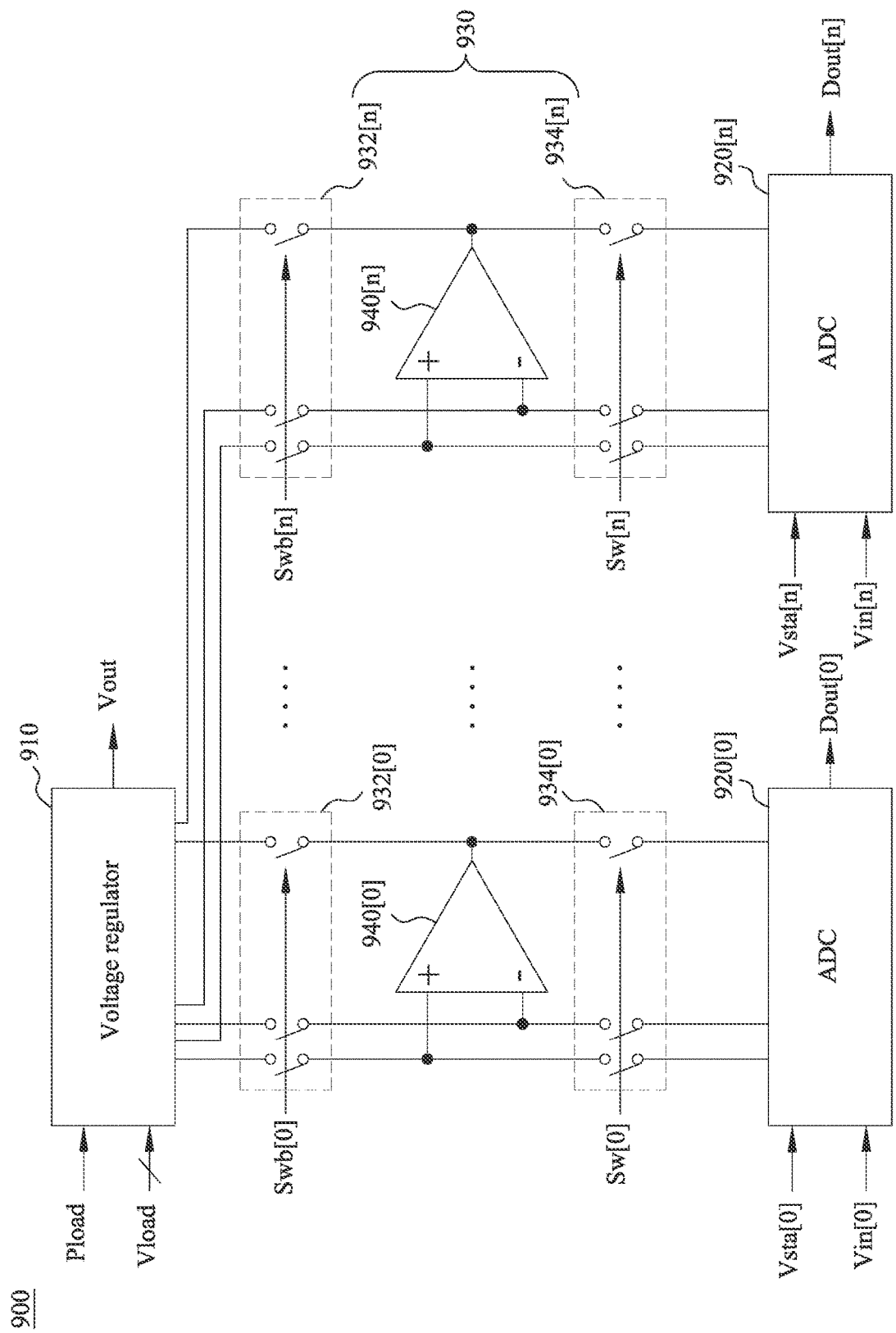
FIG. 9 is a simplified functional block diagram of an analog circuit according to one embodiment of the present disclosure.

FIG. 9 is a simplified functional block diagram of an analog circuit 900 according to one embodiment of the present disclosure. The analog circuit 900 comprises a voltage regulator 910, a plurality of ADCs 920[0]-920[n], a multiplexer 930 and a plurality of comparators 940[0]-940[n]. The multiplexer 930 is coupled with the voltage regulator 910, the ADCs 920[0]-920[n] and the comparators 940[0]-940[n]. The ADCs 920[0]-920[n] are configured to convert the input voltages Vin[0]-Vin[n] to generate a plurality of digital signals Dout[0]-Dout[n], respectively. The multiplexer 930 is configured to conduct the comparators 940[0]-940[n] to either the voltage regulator 910 or the ADCs 920[0]-920[n]. In some embodiments, the voltage regulator 910 is a digital low dropout linear regulator, but this disclosure is not limited thereto.

The multiplexer 930 comprises a plurality of switch circuits 932[0]-932[n] and a plurality of switch circuits 934[0]-934[n]. The switch circuits 932[0]-932[n] are controlled by multiplexing signals Swb[0]-Swb[n], respectively, and the switch circuits 934[0]-934[n] are controlled by multiplexing signals Sw[0]-Sw[n], in which the multiplexing signals Swb[0]-Swb[n] are in opposite phases to the multiplexing signals Sw[0]-Sw[n], respectively. First terminals of the switch circuits 932[0]-932[n] are coupled with the voltage regulator 910, and second terminals of the switch circuits 932[0]-932[n] are coupled with the comparators 940[0]-940[n], respectively. First terminals of the switch circuits 934[0]-934[n] are coupled with the comparators 940[0]-940[n], respectively, and second terminals of the switch circuits 934[0]-934[n] are coupled with the ADCs 920[0]-920[n], respectively.

When the voltage regulator 910 is triggered by the control signal Pload, the multiplexer 930 conducts the switch circuits 932[0]-932[n] to couple all of the comparators 940[0]-940[n] to the voltage regulator 910. Referring to FIG. 2 and FIG. 9, for example, the voltage regulator 200 of FIG. 2 can be used to implement the voltage regulator 910 of FIG. 9. When the voltage regulator 910 is triggered by the control signal Pload, the comparators 940[0]-940[n] of FIG. 9 are operated as (or can be understood as "replaced") the comparators 212[0]-212[n] of FIG. 2, respectively.

On the other hand, when one or more ADCs of the ADCs 920[0]-920[n] are triggered, the multiplexer 930 conducts corresponding one or more of the switch circuits 934[0]-934[n]. As a result, corresponding one or more comparators of the comparators 940[0]-940[n] are conducted to the triggered one or more ADCs, respectively. For example, if the ADCs 920[0]-920[2] are triggered, the switch circuits 934[0]-934[2] are conducted and the switch circuits 934[3]-934[n] are switched off, so as to conduct the comparators 940[0]-940[2] to the ADCs 920[0]-920[2], respectively.

Each of the ADCs 920[0]-920[n] can be implemented by the incremental delta-sigma ADC, the delta-sigma modulator or the SAR ADC, but this disclosure is not limited thereto. For example, if the ADC 920[0] is implemented by the incremental delta-sigma ADC, the comparator 940[0] is configured to operate as the integrator of the ADC 920[0]; if the ADC 920[0] is implemented by the delta-sigma modulator, the comparator 940[0] is configured to operate as the quantizer of the ADC 920[0]; if the ADC 920[0] is implemented by the SAR ADC, the comparator 940[0] is coupled between the SAR logic circuit and the sampling capacitor array of the ADC 920[0], and so forth. The foregoing descriptions regarding to other corresponding implementations and advantages of the analog circuit 100 are also applicable to the analog circuit 900. For the sake of brevity, those descriptions are omitted.

As can be appreciated from the above, the analog circuit of the present disclosure can switch the comparator to the ADC when the voltage regulator is free from adjust the power thereof, and also can switch the comparator to the voltage regulator when the ADC is free from performing the analog-to-digital conversion. By allowing different circuit blocks to share the comparator, the analog circuit of the present disclosure has the advantages of reducing the overall circuit area and increasing the flexibility of circuit layout.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

In addition, the singular forms "a," "an," and "the" herein are intended to comprise the plural forms as well, unless the context clearly indicates otherwise.

Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

What is claimed is:

1. An analog circuit, comprising:
    a voltage regulator, configured to generate an output voltage;
    at least one analog-to-digital convertor (ADC), configured to generate at least one digital signal;
    at least one comparator; and
    a multiplexer, coupled with the voltage regulator, the at least one ADC and the at least one comparator, and configured to conduct the at least one comparator to either the voltage regulator or the at least one ADC,
    wherein when the voltage regulator is triggered, the multiplexer conducts the at least one comparator to the voltage regulator, and the voltage regulator generates the output voltage according to an output of the at least one comparator,
    wherein when the at least one ADC is triggered, the multiplexer conducts the at least one comparator to the at least one ADC, and the at least one ADC generates the at least one digital signal according to the output of the at least one comparator.

2. The analog circuit of claim 1, wherein when the at least one ADC is triggered, the at least one comparator is operated as part of an integrator of the at least one ADC.

3. The analog circuit of claim 1, wherein the at least one comparator comprises a plurality of comparators, the multiplexer is coupled with the voltage regulator, the at least one ADC and the plurality of comparators, and the multiplexer is configured to conduct the plurality of comparators to the voltage regulator and one of the at least one ADC,
    wherein when the voltage regulator is triggered, the multiplexer conducts all of the plurality of comparators to the voltage regulator, and the voltage regulator generates the output voltage according to outputs of the plurality of comparators,
    wherein when the at least one ADC is triggered, the multiplexer conducts all of the plurality of comparators to the at least one ADC, and the at least one ADC generates the at least one digital signal according to the plurality of comparators.

4. The analog circuit of claim 3, wherein when the at least one ADC is triggered, the plurality of comparators are operated as parts of a plurality of integrators of the at least one ADC, respectively.

5. The analog circuit of claim 1, further comprises a control circuit comprising:
    a first register, configured to output a clock signal, wherein when the first register is triggered by a first control signal, the clock signal has a first logic value, and when the first register is triggered by a second control signal, the clock signal has a second logic value, wherein the first control signal is configured to trigger the voltage regulator, and the second control signal is configured to trigger the at least one ADC; and
    a second register, configured to output a multiplexing signal to the multiplexer, wherein when the second register is triggered by the clock signal, the multiplexing signal has the first logic value, and when the second register is triggered by a third control signal, the multiplexing signal has the second logic value, wherein the third control signal indicates that an analog-to-digital conversion of the at least one ADC is completed.

6. The analog circuit of claim 5, wherein the first register comprises:
    a clock input node, configured to receive the first control signal;
    a reset node, configured to receive the second control signal; and
    a data output node, configured to output the clock signal.

7. The analog circuit of claim 5, wherein the second register comprises:
    a clock input node, configured to receive the clock signal;
    a reset node, configured to receive the third control signal; and
    a data output node, configured to output the multiplexing signal.

8. The analog circuit of claim 1, wherein the at least one ADC comprises a delta-sigma modulator, and when the multiplexer conducts the at least one comparator to the at least one ADC, the at least one comparator is operated as a quantizer of the delta-sigma modulator.

9. The analog circuit of claim 1, wherein the at least one ADC comprises a SAR ADC, and the SAR ADC comprises a SAR logic circuit and a sampling capacitor array,
wherein when the multiplexer conducts the at least one comparator to the at least one ADC, the at least one comparator is coupled between the SAR logic circuit and the sampling capacitor array.

10. The analog circuit of claim 1, wherein the at least one ADC comprises a plurality of ADCs, the at least one comparator comprises a plurality of comparators, the multiplexer is coupled with the voltage regulator, the plurality of ADCs and the plurality of comparators, and the multiplexer is configured to conduct the plurality of comparators to either the voltage regulator or the plurality of ADCs,
wherein when the voltage regulator is triggered, the multiplexer conducts all of the plurality of comparators to the voltage regulator, and the voltage regulator generates the output voltage according to outputs of the plurality of comparators,
wherein when one or more ADCs of the plurality of ADCs are triggered, the multiplexer conducts corresponding one or more comparators of the plurality of comparators to the one or more ADCs, respectively, and the one or more ADCs generate one or more digital signals of the at least one digital signal according to outputs of the one or more comparators.

11. A comparator sharing method of an analog circuit, comprising:
when a voltage regulator is triggered, using a multiplexer to conduct at least one comparator to the voltage regulator, wherein the voltage regulator generates an output voltage of the voltage regulator according to an output of the at least one comparator; and
when at least one ADC is triggered, using the multiplexer to conduct the at least one comparator to the at least one ADC, wherein the at least one ADC generates at least one digital signal of the at least one ADC according to the output of the at least one comparator,
wherein the multiplexer is coupled with the voltage regulator, the at least one ADC and the at least one comparator.

12. The method of claim 11, wherein when the at least one ADC is triggered, the at least one comparator is operated as part of an integrator of the at least one ADC.

13. The method of claim 11, wherein the at least one comparator comprises a plurality of comparators, and the multiplexer is coupled with the voltage regulator, the at least one ADC and the plurality of comparators,
wherein when the voltage regulator is triggered, using the multiplexer to conduct the at least one comparator to the voltage regulator comprises: when the voltage regulator is triggered, using the multiplexer to conduct all of the plurality of comparators to the voltage regulator, wherein the voltage regulator generates the output voltage according to outputs of the plurality of comparators,
wherein when the at least one ADC is triggered, using the multiplexer to conduct the at least one comparator to the at least one ADC comprises: when the at least one ADC is triggered, using the multiplexer to conduct all of the plurality of comparators to the at least one ADC, wherein the at least one ADC generates the at least one digital signal according to the outputs of the plurality of comparators.

14. The method of claim 13, wherein when the at least one ADC is triggered, the plurality of comparators are operated as parts of plurality of integrators of the at least one ADC, respectively.

15. The method of claim 11, further comprising:
when a first register is triggered by a first control signal, using the first register to output a clock signal having a first logic value, wherein the first control signal is configured to trigger the voltage regulator;
when the first register is triggered by a second control signal, using the first register to output the clock signal having a second logic value, wherein the second control signal is configured to triggered the at least one ADC;
when a second register is triggered by the clock signal, using the second register to output a multiplexing signal having the first logic value to the multiplexer; and
when the second register is triggered by a third control signal, using the second register to output the multiplexing signal having the second logic value, wherein the third control signal indicates that an analog-to-digital conversion of the at least one ADC is completed.

16. The method of claim 11, wherein the at least one ADC comprises a delta-sigma modulator, and when the multiplexer conducts the at least one comparator to the at least one ADC, the at least one comparator is operated as a quantizer of the delta-sigma modulator.

17. The method of claim 11, wherein the at least one ADC comprises a SAR ADC, and the SAR ADC comprises a SAR logic circuit and a sampling capacitor array,
wherein when the multiplexer conducts the at least one comparator to the at least one ADC, the at least one comparator is coupled between the SAR logic circuit and the sampling capacitor array.

18. The method of claim 11, wherein the at least one ADC comprises a plurality of ADCs, the at least one comparator comprises a plurality of comparators, the multiplexer is coupled with the voltage regulator, the plurality of ADCs and the plurality of comparators,
wherein when the voltage regulator is triggered, using the multiplexer to conduct the at least one comparator to the voltage regulator comprises: when the voltage regulator is triggered, using the multiplexer to conduct all of the plurality of comparators to the voltage regulator, wherein the voltage regulator generates the output voltage according to the plurality of comparators,
wherein when the at least one ADC is triggered, using the multiplexer to conduct the at least one comparator to the at least one ADC comprises: when one or more ADCs of the plurality of ADCs are triggered, using the multiplexer to conduct corresponding one or more comparators of the plurality of comparators to the one or more ADCs, respectively, wherein the one or more ADCs generate one or more digital signals of the at least one digital signal according to outputs of the one or more comparators.

* * * * *